United States Patent
Xie

(10) Patent No.: US 10,930,851 B2
(45) Date of Patent: Feb. 23, 2021

(54) MANUFACTURING METHOD FOR CARBON NANOTUBE COMPOSITE FILM, CARBON NANOTUBE TFT AND MANUFACTURING METHOD FOR THE SAME

(71) Applicant: SHENZHEN CHINA STAR OPTOELECTRONICS SEMICONDUCTOR DISPLAY TECHNOLOGY CO., LTD., Guangdong (CN)

(72) Inventor: Huafei Xie, Guangdong (CN)

(73) Assignee: SHENZHEN CHINA STAR OPTOELECTRONICS SEMICONDUCTOR DISPLAY TECHNOLOGY CO., LTD., Guangdong (CN)

( * ) Notice: Subject to any disclaimer, the term of this patent is extended or adjusted under 35 U.S.C. 154(b) by 338 days.

(21) Appl. No.: 16/079,031

(22) PCT Filed: Jul. 27, 2018

(86) PCT No.: PCT/CN2018/097444
§ 371 (c)(1),
(2) Date: Aug. 22, 2018

(87) PCT Pub. No.: WO2020/015002
PCT Pub. Date: Jan. 23, 2020

(65) Prior Publication Data
US 2020/0357999 A1    Nov. 12, 2020

(30) Foreign Application Priority Data
Jul. 18, 2018 (CN) .......................... 201810788180.2

(51) Int. Cl.
*H01L 51/40*   (2006.01)
*H01L 51/00*   (2006.01)
(Continued)

(52) U.S. Cl.
CPC ........ *H01L 51/0048* (2013.01); *C01B 32/159* (2017.08); *C01B 32/172* (2017.08);
(Continued)

(58) Field of Classification Search
CPC . H01L 29/786; H01L 51/004; H01L 51/0048; H01L 51/0093; C01B 32/159; C01B 32/172; C01B 32/174
(Continued)

(56) References Cited

U.S. PATENT DOCUMENTS

2017/0194581 A1*   7/2017   Li ...................... H01L 51/0048

FOREIGN PATENT DOCUMENTS

| CN | 101759177 A | 6/2010 |
| CN | 102791808 A | 11/2012 |

(Continued)

*Primary Examiner* — Brook Kebede
(74) *Attorney, Agent, or Firm* — Leong C. Lei

(57) ABSTRACT

A manufacturing method for carbon nanotube composite film is disclosed. The method comprises steps of: providing a substrate; coating a first aqueous solution dissolved with a charged polymer on a substrate to form a polymer film; dispersing a single-wall carbon nanotube powder into a second aqueous solution dissolved with a charged compound in order to obtain a semiconductor-type single-wall carbon nanotube aqueous solution, and charge properties of the charged compound and the charged polymer are opposite; coating the semiconductor-type single-wall carbon nanotube aqueous solution on the polymer film; after standing for a predetermined period of time, washing with a deionized water to remove an unabsorbed semiconductor-type single-wall carbon nanotube and excess charged polymer; and air drying, forming a carbon nanotube film on the polymer film. A manufacturing method for carbon nanotube TFT and a carbon nanotube TFT are also disclosed. The carbon nanotubes can be well tiled onto the substrate.

20 Claims, 4 Drawing Sheets

(51) Int. Cl.
*C01B 32/159* (2017.01)
*C01B 32/172* (2017.01)
*C01B 32/174* (2017.01)
*B82Y 10/00* (2011.01)
*B82Y 40/00* (2011.01)
*G03F 7/16* (2006.01)
*G03F 7/20* (2006.01)
*G03F 7/26* (2006.01)
*H01L 51/05* (2006.01)

(52) U.S. Cl.
CPC .......... *C01B 32/174* (2017.08); *H01L 51/004* (2013.01); *H01L 51/0093* (2013.01); *B82Y 10/00* (2013.01); *B82Y 40/00* (2013.01); *C01B 2202/02* (2013.01); *C01B 2202/22* (2013.01); *G03F 7/16* (2013.01); *G03F 7/20* (2013.01); *G03F 7/26* (2013.01); *H01L 51/0018* (2013.01); *H01L 51/0021* (2013.01); *H01L 51/0541* (2013.01)

(58) Field of Classification Search
USPC .................................................. 438/99, 149
See application file for complete search history.

(56) References Cited

FOREIGN PATENT DOCUMENTS

| | | | |
|---|---|---|---|
| CN | 103236494 A | | 8/2013 |
| CN | 103897183 A | | 7/2014 |
| CN | 104103812 A | | 10/2014 |
| CN | 106298815 A | | 1/2017 |
| KR | 20150000043 A | * | 1/2015 |

* cited by examiner

MANUFACTURING METHOD FOR CARBON NANOTUBE COMPOSITE FILM, CARBON NANOTUBE TFT AND MANUFACTURING METHOD FOR THE SAME

RELATED APPLICATIONS

The present application is a National Phase of International Application Number PCT/CN2018/097444, filed Jul. 27, 2018, and claims the priority of China Application No. 201810788180.2, filed Jul. 18, 2018.

FIELD OF THE INVENTION

The present invention relates to the technical field of carbon nano material application, and more particularly to a manufacturing method for carbon nanotube composite film, carbon nanotube TFT and manufacturing method for the same.

BACKGROUND OF THE INVENTION

Carbon is one of the most abundant materials with nanostructures and properties such as fullerenes, carbon quantum dots, carbon nanotubes, and graphene that attracted great research interests and experimental applications for researcher due to its excellent chemical, physical, mechanical and electronic properties.

Among many carbon nanomaterials, carbon nanotubes are tubular one-dimensional carbon materials composed of carbon atoms periodically and closely arranged in a benzene ring structure (i.e., a hexagonal honeycomb structure). Due to their excellent and unique electrical and optical properties, in recent years, its application research in the field of electronic devices has become more and more deeply. Semiconductor single-wall carbon nanotubes are considered to be one of the most valuable electrical materials. Due to their excellent mechanical, thermal, electrical and chemical stability, they can be used in high-frequency devices to improve the frequency response range of devices. The size of traditional Si semiconductor devices continues to shrink, and some unavoidable constraints continue to emerge, such as short channel effects, statistical fluctuations in doping concentration at small sizes, resulting in device non-uniformities. However, single-wall carbon nanotubes can be fabricated with n-type or p-type transistors and doped with integrated circuits, which may be replaced by silicon-based semiconductor applications.

The unique properties generated by combining pure carbon form or hybrid structure of the nano-carbon materials in the dimensions and quantum confinement effects, it can produce unprecedented physical and mechanical properties, providing a potential way for the construction of carbon-based devices.

A carbon nanotube has great application prospects in electronic devices and flexible devices due to their high mobility, adjustable band gap, good stability, good light transmission and good flexibility. Since the carbon nanotube is discovered in 1997, the carbon nanotube has been extensively studied in single-wall and multi-wall controlled, metal and semiconducting purification, performance, and applications. Among them, single-stranded carbon nanotubes are the focus and difficulty of current carbon nanotube research. At present, there is no effective method for efficiently preparing high-quality semiconductor single-wall carbon nanotubes at home and abroad, in order to apply the carbon nanotube in thin-film transistor and flexible electronic device in the high-end applications, there is an urgent need to develop a single-conductivity and single-wall carbon nanotube manufacturing technology.

SUMMARY OF THE INVENTION

In view of the deficiencies of the prior art, the present invention provides a manufacturing method for carbon nanotube composite film, a carbon nanotube TFT and a manufacturing method for the same, and the semiconductor type single-wall carbon nanotube has a high film forming quality, simple process, and high production efficiency, which is conducive to saving production costs and reducing environmental pollution.

In order to realize the above purpose, the present adopts the following technology solution:

providing a substrate;

coating a first aqueous solution dissolved with a charged polymer on a substrate to form a polymer film;

dispersing a single-wall carbon nanotube powder into a second aqueous solution dissolved with a charged compound in order to obtain a semiconductor-type single-wall carbon nanotube aqueous solution, and charge properties of the charged compound and the charged polymer are opposite;

coating the semiconductor-type single-wall carbon nanotube aqueous solution on the polymer film;

after standing for a predetermined period of time, washing with a deionized water to remove an unabsorbed semiconductor-type single-wall carbon nanotube and excess charged polymer; and air drying, forming a carbon nanotube film on the polymer film.

As one of the embodiments, the method further comprises a step of after the first aqueous solution dissolved with the charged polymer is coated on the substrate, the substrate is blown dry by an air knife, after coating the semiconductor-type single-wall carbon nanotube aqueous solution on the polymer film, through the air knife to blow dry the polymer film.

As one of the embodiments, the charged polymer is polylysine, polyethyleneimine or chitosan.

As one of the embodiments, the amphiphilic charged small molecule compound is sodium cholate or sodium deoxycholate.

As one of the embodiments, the step of dispersing a single-wall carbon nanotube powder into a second aqueous solution dissolved with a charged compound in order to obtain a semiconductor-type single-wall carbon nanotube aqueous solution, and charge properties of the charged compound and the charged polymer are opposite comprises a step of: ultrasonically dispersing a single-wall carbon nanotube powder prepared by the high-pressure carbon monoxide method in the second aqueous solution C dissolved with an amphiphilic charged small molecule compound, wherein the single-wall carbon nanotube powder is a mixed powder of a metal-type single-wall carbon nanotube and a semiconductor-type single-wall carbon nanotube, and the amphiphilic charged small molecule selectively encapsulates the semiconductor-type single-wall carbon nanotube; and removing metal-type single-wall carbon nanotube by a centrifugation method to obtain a semiconductor-type single-wall carbon nanotube aqueous solution.

As one of the embodiments, the amphiphilic charged small molecule compound is sodium cholate or sodium deoxycholate.

Another purpose of the present invention is to provide a manufacturing method for carbon nanotube TFT, comprising:

providing a substrate as a base;

using the manufacturing method for carbon nanotube composite film as above to sequentially prepare a polymer film and a carbon nanotube film on the substrate;

respectively patterning the carbon nanotube film and the polymer film to obtain a patterned carbon nanotube active layer and a pattered polymer layer; and forming a source electrode/drain electrode on the carbon nanotube active layer.

As one of the embodiments, the step of respectively patterning the carbon nanotube film and the polymer film to obtain a patterned carbon nanotube active layer and a patterned polymer layer comprises a step of: coating a photoresist on a surface of the carbon nanotube film; exposing and developing the photoresist, and removing the carbon nanotube film and the polymer film not covered by the photoresist by an oxygen plasma dry etching method to obtain the carbon nanotube active layer and the polymer layer.

As one of the embodiments, the method further comprise a step of before preparing the polymer film and the carbon nanotube film on the substrate, sequentially forming a patterned gate electrode on the substrate and depositing a gate insulation layer covering the gate electrode on the substrate.

Or, the manufacturing method for carbon nanotube TFT further comprises a step of after the source electrode/drain electrode is completed, depositing gate insulation layer that simultaneously covers the carbon nanotube active layer and the source electrode/drain electrode, and forming a gate electrode directly opposite to the carbon nanotube active layer on the gate insulation layer.

Another purpose of the present invention is to provide a carbon nanotube TFT formed by the manufacturing method for carbon nanotube TFT as above, comprising: a substrate, a polymer layer disposed on the substrate, and a carbon nanotube active layer on the polymer layer, a source electrode/drain electrode, a gate insulation layer and a gate electrode.

Through coating a polymer aqueous solution having a charge property opposite to a charge property of a carbon nanotube aqueous solution firstly. Then, coating the carbon nanotube aqueous solution. A charged polymer has good adsorption and flattening properties on the substrate. The carbon nanotube can be tiled onto the substrate by charge attraction of the polymer due to the surface of the carbon nanotube is packaged with a charged small molecules of compound.

DETAILED DESCRIPTION OF PREFERRED EMBODIMENTS

The present invention will be further described in detail below with reference to the accompanying drawings and embodiments. It is understood that the specific embodiments described herein are merely illustrative of the invention and are not intended to limit the invention.

First Embodiment

Figure 1:
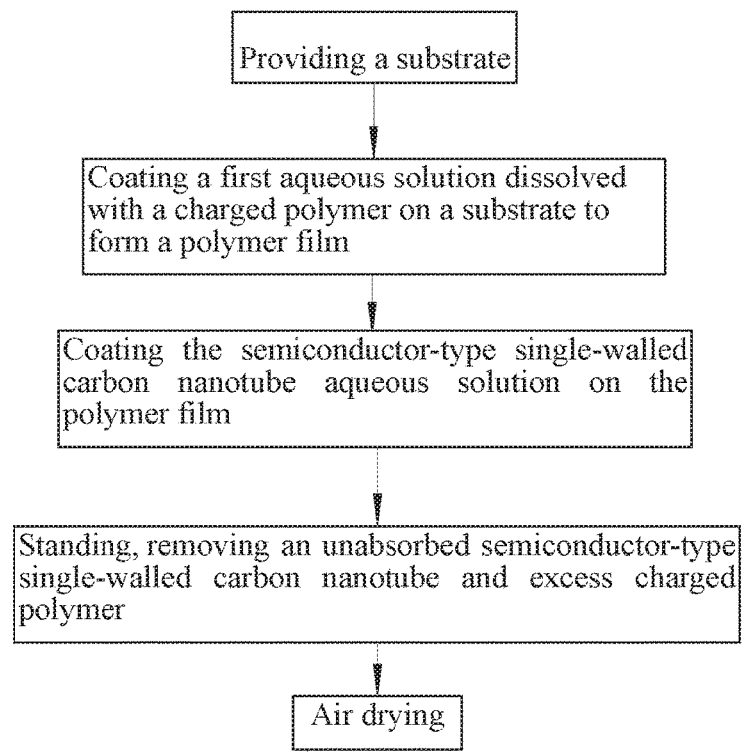
FIG. 1 is a schematic diagram of a manufacturing method for carbon nanotube composite film according to a first embodiment of the present invention.

Referring to FIG. 1, the manufacturing method for carbon nanotube composite film of the present embodiment mainly includes:

First, providing a substrate;

Coating a first aqueous solution dissolved with a charged polymer on a substrate to form a polymer film;

Dispersing a single-wall carbon nanotube powder into a second aqueous solution dissolved with a charged compound in order to obtain a semiconductor-type single-wall carbon nanotube aqueous solution, and charge properties of the charged compound and the charged polymer are opposite;

Coating the semiconductor-type single-wall carbon nanotube aqueous solution on the polymer film, and drying the polymer film by an air knife;

After standing for a predetermined period of time, washing with a deionized water to remove an unabsorbed semiconductor-type single-wall carbon nanotube and excess charged polymer, the predetermined time for standing is 8 to 12 minutes, preferably 10 minutes;

Air drying, forming a carbon nanotube film on the polymer film such that the carbon nanotube film adheres well to the substrate.

Wherein, in the first aqueous solution, the charged polymer may be polylysine, polyethyleneimine or chitosan, and the first aqueous solution is coated on the substrate by a solution method, for example, by dripping, spin coating, lifting coating by pulling or printing. After the first aqueous solution dissolved with the charged polymer is coated on the substrate, the substrate can also be blown dry by an air knife so that the polymer film can be attached to the surface of the substrate in a flat manner.

Figure 2:
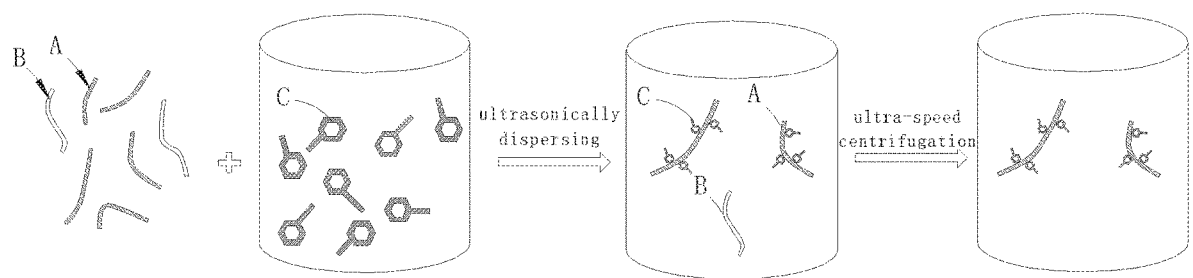
FIG. 2 is a schematic diagram of a preparation process of a carbon nanotube solution according to the first embodiment of the present invention.

As shown in FIG. 2, the manufacturing process of a semiconductor-type single-wall carbon nanotube aqueous solution is introduced, which specifically includes:

(1) preparing a single-wall carbon nanotube by a high-pressure carbon monoxide method to form a mixed powder of a metal-type single-wall carbon nanotube B and a semiconductor-type single-wall carbon nanotube A;

(2) ultrasonically dispersing the single-wall carbon nanotube prepared by the high-pressure carbon monoxide method in the second aqueous solution C dissolved with an amphiphilic charged small molecule compound, so that the amphiphilic charged small molecule selectively encapsulates the semiconductor-type single-wall carbon nanotube A, and the metal-type single-wall carbon nanotube B is separated and precipitated, and the amphiphilic charged small molecule compound may be sodium cholate or sodium deoxycholate;

(3) removing metal-type single-wall carbon nanotube by an ultra-high-speed centrifugation method to obtain a semiconductor-type single-wall carbon nanotube aqueous solution, and in the semiconductor-type single-wall carbon nanotube aqueous, the semiconductor-type single-wall carbon nanotube is dispersed in water.

Since the charged polymer has good adsorption and flattening properties on the substrate, the carbon nanotubes can be well tiled onto the substrate by charge attraction with the polymer due to the surface encapsulating the charged compound small molecules.

Figure 3:
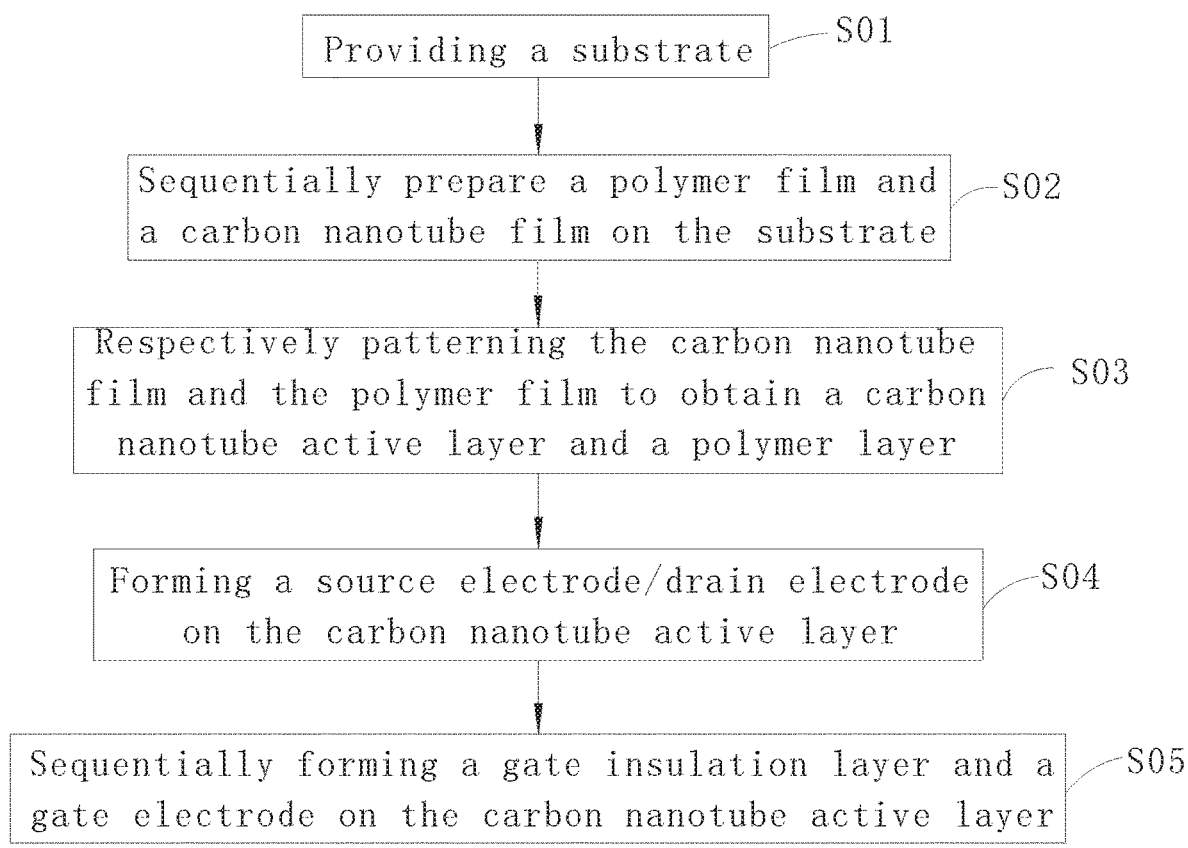
FIG. 3 is a schematic diagram of a manufacturing method for carbon nanotube TFT according to the first embodiment of the present invention.
Figure 4:
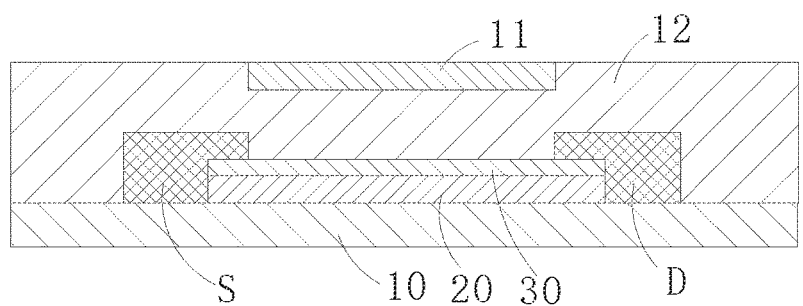
FIG. 4 is a schematic structural diagram of a carbon nanotube TFT according to the first embodiment of the present invention.

As shown in FIG. 3 and FIG. 4, a manufacturing method for carbon nanotube TFT of the present embodiment mainly includes:

S01, providing a substrate 10 as a base;

S02, using the above manufacturing method for carbon nanotube composite film to sequentially prepare a polymer film 2 and a carbon nanotube film 3 on the substrate 10;

S03, respectively patterning the carbon nanotube film 3 and the polymer film 2 to obtain a patterned carbon nanotube active layer 30 and a patterned polymer layer 20;

Wherein the step of respectively patterning the carbon nanotube film 3 and the polymer film 2 specifically includes:

First, coating a photoresist on a surface of the carbon nanotube film 3;

Then, exposing the photoresist by a photomask to form a photoresist reserved region and a photoresist non-reserved region, and then developing the photoresist non-reserved region, and removing the photoresist non-reserved region in order to expose a carbon nanotube film to be etched, and finally, dry etching and sequentially removing the carbon nanotube film 3 and the polymer film 2 not covered by the photoresist by oxygen plasma, and the carbon nanotube active layer 30 and the polymer layer are obtained correspondingly. The carbon nanotube film 3 and the polymer film 2 have the same pattern, and can be exposed by the same mask, saving the mask and improving the process efficiency.

S04, forming a source electrode/drain electrode S/D on the carbon nanotube active layer 30;

S05, sequentially forming a gate insulation layer 12 and a gate electrode 11 on the carbon nanotube active layer 30. In this embodiment, the gate electrode 11 is a top gate, and the gate insulation layer 12 is formed after the source electrode/drain electrode S/D is completed, and through a deposition method to form on the substrate 10, wherein the gate insulation layer 12 simultaneously covers the carbon nanotube active layer 30 and the source electrode/drain electrode S/D. After the gate insulation layer 12 is deposited, and on the gate insulation layer 12, forming the gate electrode 11 directly opposite to the carbon nanotube active layer 30, and the gate electrode 11 is deposited in a surface channel of the gate insulation layer 12 to be flush with the surface of the gate insulation layer 12.

As shown in FIG. 4, the carbon nanotube TFT prepared according to the above manufacturing method includes: a substrate 10, a polymer layer 20 disposed on the substrate 10, and a carbon nanotube active layer 30 on the polymer layer 20, a source electrode/drain electrode S/D, a gate insulation layer 12, and a gate electrode 11 disposed on the polymer layer 20. Wherein the source electrode/drain electrode S/D is formed on the substrate 10 and the carbon nanotube active layer 30, and the gate insulation layer 12 is formed on the substrate 10, simultaneously covering the carbon nanotube active layer 30, the source electrode/drain electrode S/D, and the gate electrode 11 is located in the surface channel of the gate insulation layer 12, flushing with the surface of the gate insulation layer 12.

Second Embodiment

Figure 5:
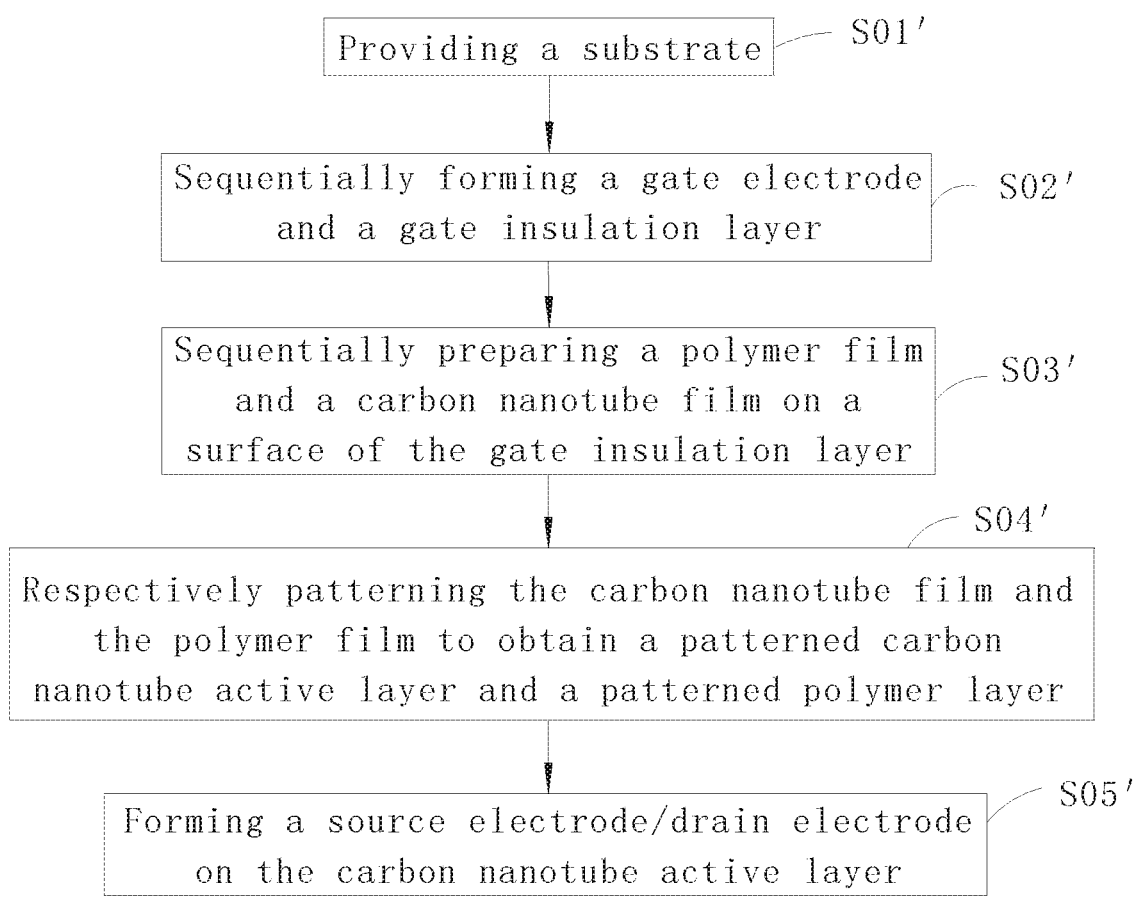
FIG. 5 is a schematic diagram of a manufacturing method for carbon nanotube TFT according to a second embodiment of the present invention.
Figure 6:
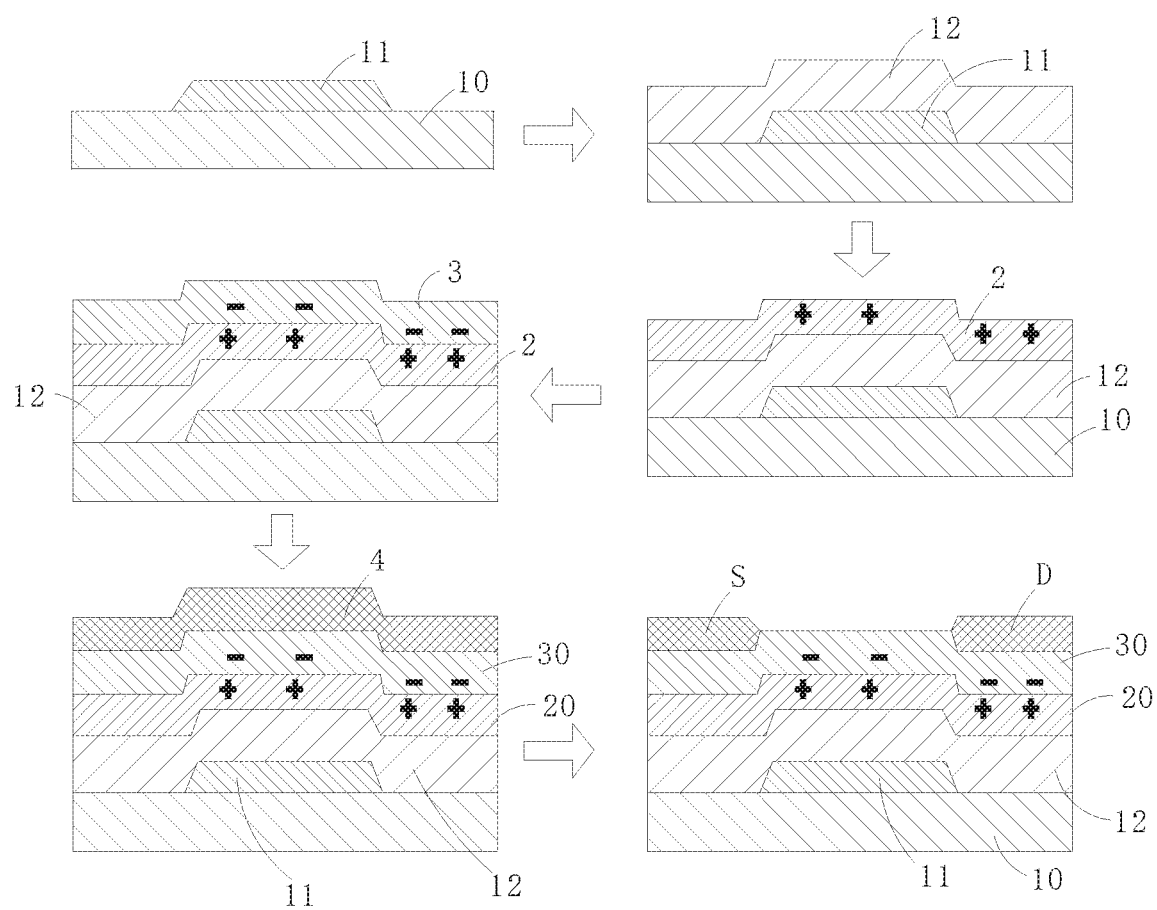
FIG. 6 is a schematic diagram of a manufacturing process for carbon nanotube TFT according to a second embodiment of the present invention.

As shown in FIG. 5 and FIG. 6, unlike the first embodiment, the carbon nanotube TFT of the embodiment is a bottom gate TFT, and the carbon nanotube TFT still includes a substrate 10, a polymer layer 20, and a carbon nanotube active layer 30, a source electrode/drain electrode S/D, a gate insulation layer 12 and a gate electrode 11 on the polymer layer 20. The difference is that the gate insulation layer 12 and the gate electrode 11 are located between the polymer layer 20 and the substrate 10, the gate insulation layer 12 and the gate electrode 11 are both formed on the substrate 10, the gate insulation layer 12 covers the gate electrode 11, and the polymer layer 20 is formed on the surface of the gate insulation layer 12.

The manufacturing method for the carbon nanotube TFT of the embodiment mainly includes:

S01', providing a substrate 10;

S02', sequentially forming a patterned gate electrode 11 and a gate insulation layer 12 covering the gate electrode 11 on the substrate 10;

S03', using the above manufacturing method for a carbon nanotube composite film, sequentially preparing a polymer film 2 and a carbon nanotube film 3 on a surface of the gate insulation layer 12 on the substrate 10;

S04', respectively patterning the carbon nanotube film 3 and the polymer film 2 to obtain a patterned carbon nanotube active layer 30 and a patterned polymer layer 20;

S05', forming a source electrode/drain electrode S/D on the carbon nanotube active layer 30, specifically, firstly, depositing a metal layer on the carbon nanotube active layer 30, and then etching a channel on a surface of the metal layer that penetrates to the carbon nanotube active layer 30.

In summary, the invention is prepared from the material purification, is beneficial to construct a green, low-cost device, and adopts a self-assembly technology combined with a solution coating method to form an active layer film, without special environment such as vacuum high temperature and high pressure, which is easy to carry out. Through coating a polymer aqueous solution having a charge property opposite to a charge property of a carbon nanotube aqueous solution firstly. Then, coating the carbon nanotube aqueous solution. A charged polymer has good adsorption and flattening properties on the substrate. The carbon nanotube can be tiled onto the substrate by charge attraction of the polymer due to the surface of the carbon nanotube is packaged with a charged small molecules of compound.

The above description is only a specific embodiment of the present application, and it should be noted that those skilled in the art can also make some improvements without departing from the principle of the present application. It should be considered as the protection scope of the present application.

What is claimed is:

1. A manufacturing method for carbon nanotube composite film, comprising:

providing a substrate;

coating a first aqueous solution dissolved with a charged polymer on a substrate to form a polymer film;

dispersing a single-wall carbon nanotube powder into a second aqueous solution dissolved with a charged compound in order to obtain a semiconductor-type single-wall carbon nanotube aqueous solution, and charge properties of the charged compound and the charged polymer are opposite;

coating the semiconductor-type single-wall carbon nanotube aqueous solution on the polymer film;

after standing for a predetermined period of time, washing with a deionized water to remove an unabsorbed semiconductor-type single-wall carbon nanotube and excess charged polymer; and air drying, forming a carbon nanotube film on the polymer film.

2. The manufacturing method for carbon nanotube composite film according to claim 1, wherein the method further comprises a step of after the first aqueous solution dissolved with the charged polymer is coated on the substrate, the substrate is blown dry by an air knife, after coating the semiconductor-type single-wall carbon nanotube aqueous solution on the polymer film, through the air knife to blow dry the polymer film.

3. The manufacturing method for carbon nanotube composite film according to claim 2, wherein the charged polymer is polylysine, polyethyleneimine or chitosan.

4. The manufacturing method for carbon nanotube composite film according to claim 1, wherein the step of dispersing a single-wall carbon nanotube powder into a second aqueous solution dissolved with a charged compound in order to obtain a semiconductor-type single-wall carbon nanotube aqueous solution, and charge properties of the charged compound and the charged polymer are opposite comprises a step of:

ultrasonically dispersing a single-wall carbon nanotube powder prepared by the high-pressure carbon monoxide method in the second aqueous solution dissolved with an amphiphilic charged small molecule compound, wherein the single-wall carbon nanotube powder is a mixed powder of a metal-type single-wall carbon nanotube and a semiconductor-type single-wall carbon nanotube, and the amphiphilic charged small molecule selectively encapsulates the semiconductor-type single-wall carbon nanotube; and removing metal-type single-wall carbon nanotube by a centrifugation method to obtain a semiconductor-type single-wall carbon nanotube aqueous solution.

5. The manufacturing method for carbon nanotube composite film according to claim 4, wherein the amphiphilic charged small molecule compound is sodium cholate or sodium deoxycholate.

6. The manufacturing method for carbon nanotube composite film according to claim 2, wherein the step of dispersing a single-wall carbon nanotube powder into a second aqueous solution dissolved with a charged compound in order to obtain a semiconductor-type single-wall carbon nanotube aqueous solution, and charge properties of the charged compound and the charged polymer are opposite comprises a step of:

ultrasonically dispersing a single-wall carbon nanotube powder prepared by the high-pressure carbon monoxide method in the second aqueous solution dissolved with an amphiphilic charged small molecule compound, wherein the single-wall carbon nanotube powder is a mixed powder of a metal-type single-wall carbon nanotube and a semiconductor-type single-wall carbon nanotube, and the amphiphilic charged small molecule selectively encapsulates the semiconductor-type single-wall carbon nanotube; and removing metal-type single-wall carbon nanotube by a centrifugation method to obtain a semiconductor-type single-wall carbon nanotube aqueous solution.

7. The manufacturing method for carbon nanotube composite film according to claim 6, wherein the amphiphilic charged small molecule compound is sodium cholate or sodium deoxycholate.

8. A manufacturing method for carbon nanotube TFT, comprising:

providing a substrate as a base;

using the manufacturing method for carbon nanotube composite film as claimed in claim 1 to sequentially prepare a polymer film and a carbon nanotube film on the substrate;

respectively patterning the carbon nanotube film and the polymer film to obtain a patterned carbon nanotube active layer and a patterned polymer layer; and forming a source electrode/drain electrode on the carbon nanotube active layer.

9. The manufacturing method for carbon nanotube TFT according to claim 8, wherein the step of respectively patterning the carbon nanotube film and the polymer film to obtain a patterned carbon nanotube active layer and a patterned polymer layer comprises a step of:

coating a photoresist on a surface of the carbon nanotube film; and exposing and developing the photoresist, and removing the carbon nanotube film and the polymer film not covered by the photoresist by an oxygen plasma dry etching method to obtain the carbon nanotube active layer and the polymer layer.

10. The manufacturing method for carbon nanotube TFT according to claim 8, wherein the method further comprise a step of before preparing the polymer film and the carbon nanotube film on the substrate, sequentially forming a patterned gate electrode on the substrate and depositing a gate insulation layer covering the gate electrode on the substrate.

11. The manufacturing method for carbon nanotube TFT according to claim 8, wherein after the source electrode/drain electrode is completed, depositing gate insulation layer that simultaneously covers the carbon nanotube active layer and the source electrode/drain electrode, and forming a gate electrode directly opposite to the carbon nanotube active layer on the gate insulation layer.

12. The manufacturing method for carbon nanotube TFT according to claim 9, wherein the method further comprises a step of: before preparing the polymer film and the carbon nanotube film on the substrate, sequentially forming a patterned gate electrode on the substrate and depositing a gate insulation layer covering the gate electrode on the substrate.

13. The manufacturing method for carbon nanotube TFT according to claim 9, wherein after the source electrode/drain electrode is completed, depositing gate insulation layer that simultaneously covers the carbon nanotube active layer and the source electrode/drain electrode, and forming a gate electrode directly opposite to the carbon nanotube active layer on the gate insulation layer.

14. The manufacturing method for carbon nanotube TFT according to claim 9, wherein the charged polymer is polylysine, polyethyleneimine or chitosan.

15. The manufacturing method for carbon nanotube TFT according to claim 8, wherein the method further comprises a step of after the first aqueous solution dissolved with the charged polymer is coated on the substrate, the substrate is blown dry by an air knife, after coating the semiconductor-type single-wall carbon nanotube aqueous solution on the polymer film, through the air knife to blow dry the polymer film.

16. The manufacturing method for carbon nanotube TFT according to claim 8, wherein the step of dispersing a single-wall carbon nanotube powder into a second aqueous solution dissolved with a charged compound in order to obtain a semiconductor-type single-wall carbon nanotube aqueous solution, and charge properties of the charged compound and the charged polymer are opposite comprises a step of:

ultrasonically dispersing a single-wall carbon nanotube powder prepared by the high-pressure carbon monoxide method in the second aqueous solution dissolved with an amphiphilic charged small molecule compound, wherein the single-wall carbon nanotube powder is a mixed powder of a metal-type single-wall carbon nanotube and a semiconductor-type single-wall carbon nanotube, and the amphiphilic charged small molecule selectively encapsulates the semiconductor-type single-wall carbon nanotube; and removing metal-type single-wall carbon nanotube by a centrifugation method to obtain a semiconductor-type single-wall carbon nanotube aqueous solution.

17. The manufacturing method for carbon nanotube TFT according to claim 16, wherein the amphiphilic charged small molecule compound is sodium cholate or sodium deoxycholate.

18. A carbon nanotube TFT formed by the manufacturing method for carbon nanotube TFT as claimed in claim 8, comprising:
a substrate, a polymer layer disposed on the substrate, and a carbon nanotube active layer on the polymer layer, a source electrode/drain electrode, a gate insulation layer and a gate electrode.

19. The carbon nanotube TFT according to claim 18, wherein the step of respectively patterning the carbon nanotube film and the polymer film to obtain a patterned carbon nanotube active layer and a patterned polymer layer comprises a step of:

coating a photoresist on a surface of the carbon nanotube film;

exposing and developing the photoresist, and removing the carbon nanotube film and the polymer film not covered by the photoresist by an oxygen plasma dry etching method to obtain the carbon nanotube active layer and the polymer layer.

20. The carbon nanotube TFT according to claim 18, wherein the manufacturing method for carbon nanotube TFT further comprises a step of: before preparing the polymer film and the carbon nanotube film on the substrate, sequentially forming a patterned gate electrode on the substrate and depositing a gate insulation layer covering the gate electrode on the substrate.

* * * * *